United States Patent

Kanda et al.

[11] Patent Number: 5,250,781
[45] Date of Patent: Oct. 5, 1993

[54] LASER BONDING APPARATUS

[75] Inventors: Makoto Kanda; Masaharu Yoshida, both of Fukuoka, Japan

[73] Assignee: Mitsubishi Denki Kabushiki Kaisha, Tokyo, Japan

[21] Appl. No.: 780,495

[22] Filed: Oct. 22, 1991

[30] Foreign Application Priority Data

Nov. 16, 1990 [JP] Japan ................... 2-312194

[51] Int. Cl.$^5$ .................. B23K 26/12; B23K 26/14
[52] U.S. Cl. .................. 219/121.63; 29/840; 156/382; 156/497; 228/42; 228/219; 228/220
[58] Field of Search .............. 228/219, 220, 240, 42, 228/242, 243; 156/497, 382, 381; 29/840, 831, 854; 219/121.63, 121.64

[56] References Cited

U.S. PATENT DOCUMENTS

| | | | |
|---|---|---|---|
| 4,552,300 | 11/1985 | Zovko et al. | 228/242 X |
| 4,774,392 | 9/1988 | Orita | 219/121.63 |
| 4,906,812 | 3/1990 | Nied et al. | 219/121.63 |
| 4,937,006 | 6/1990 | Bickford et al. | 228/219 |
| 4,978,834 | 12/1990 | Griffaton | 219/121.64 X |
| 5,113,581 | 5/1992 | Hidese | 29/840 |

FOREIGN PATENT DOCUMENTS

| | | |
|---|---|---|
| 3238350A1 | 4/1984 | Fed. Rep. of Germany . |
| 3701013C2 | 7/1988 | Fed. Rep. of Germany . |
| 59-84841 | 6/1984 | Japan . |
| 59-142271 | 8/1984 | Japan ................... 156/497 |
| 62-67894 | 3/1987 | Japan . |
| 62-276840 | 12/1987 | Japan . |
| 63-157431 | 6/1988 | Japan . |
| 62-118817 | 11/1988 | Japan . |
| 64-15631 | 1/1989 | Japan . |
| 64-90199 | 11/1990 | Japan . |

Primary Examiner—Michael W. Ball
Assistant Examiner—Michele K. Yoder
Attorney, Agent, or Firm—Lowe, Price, Leblanc & Becker

[57] ABSTRACT

A bonding apparatus comprises a base (16) for supporting a printed circuit board (7), an atmosphere cover (1) which has a concavity (1c) covering a semiconductor device (5) mounted on the printed circuit board (7) and which is formed of laser light transmitting material, driving means (1j) for moving the atmosphere cover (1) upwards and downwards related to the base (16), pressing means (2) and (3) provided in the atmosphere cover (1) for pressing the semiconductor device (5) toward the printed circuit board (7), and laser heating means (9) for bonding a lead terminal (6) of the semiconductor device (5) with a junction (7a) of the printed circuit board (7). The laser heating means (9) irradiates laser light (9a) through the atmosphere cover (1) to bonding agent (8) applied between a junction (6a) of the lead terminal (6) of the semiconductor device (5) and the junction (7a) of the printed circuit board (7), and heats and fuses the bonding agent (8) to bond both the junctions without touching the junctions thereof. Also, inside the atmosphere cover (1), atmosphere gas supplying means (1d), (1e), (1f) and (1g) are provided for supplying atmosphere gas (4) which is employed for preventing oxidation in the bonding.

7 Claims, 3 Drawing Sheets

LASER BONDING APPARATUS

BACKGROUND OF THE INVENTION

1. Field of the Invention

The present invention relates to a bonding apparatus for connecting lead of a semiconductor device to an element, such as a substrate and the like.

2. Description of the Prior Art

FIG. 3 is a partial cross-sectional view showing a conventional bonding apparatus for a semiconductor device, which is disclosed in Japanese Utility Model Laying Open Gazette No. 59-84841, for example.

The apparatus in FIG. 3 is for bonding lead 24 to a semiconductor device 22 mounted on a base 26.

The lead 24 affixed to tape 25 has a junction 24a which is the only exposed portion. The junction 24a is set on the semiconductor device 22 with bonding agent 23 sandwiched between them, and then, a bonding tool 21 presses and heats the junction 24a from above. This causes the bonding agent 23 to fuse, and the lead 24 and the semiconductor device 22 are connected.

The related art includes embodiments disclosed in Japanese Patent Laying Open Gazettes No. 62-67894, 62-276840, 63-157431, and 1-15631.

In the conventional bonding apparatus as mentioned above, the lead 24 and the semiconductor device 22 must be bonded in the atmosphere, and therefore, in bonding them, the oxidation of the bonded junction progresses. Eventually, a bonding with high reliability cannot be obtained.

This is why flux or the like must be used in the bonding. In such a case, however, there are some disadvantages, for example, that scattered flux contaminates a surface of the semiconductor device 22, and it leads to imperfect contact.

Moreover, there also arises the problem that the bonding is performed in such a way that the bonding tool 21 directly presses the junction 24a to heat and melt the bonding agent 23, and therefore, the melted bonding agent 23 adheres to the tip of the bonding tool 21 and contaminates it.

SUMMARY OF THE INVENTION

A bonding apparatus according to the present invention comprises a base for supporting a printed circuit board; an atmosphere cover which has a concavity covering a semiconductor device mounted on the printed circuit board and which is formed of laser light transmitting material; driving means for moving the atmosphere cover upwards and downwards related to the base; pressing means provided in the atmosphere cover for pressing the semiconductor device toward the printed circuit board; atmosphere gas supplying means for supplying atmosphere gas to the concavity; and laser heating means for irradiating laser light through the atmosphere cover to bonding agent applied on junctions of the semiconductor device and the printed circuit board and heating and fusing the bonding agent.

Moreover, in another aspect of the bonding apparatus according to the present invention, the bonding apparatus comprises a base for supporting a printed circuit board; an atmosphere cover which has a concavity for covering a semiconductor device mounted on the printed circuit board and also having a part in the concavity to be in contact with an upper portion of a lead terminal of the semiconductor device and which is formed of laser light transmitting material; a holder for slidably holding the atmosphere cover in upper and lower directions; load means provided on the holder for applying a load to the atmosphere cover in downward direction; driving means for moving the holder upwards and downwards related to the printed circuit board; atmosphere gas supplying means for supplying atmosphere gas into the concavity; and laser heating means for irradiating laser light through a part of the atmosphere cover towards bonding agent applied on junctions of the semiconductor device and the printed circuit board, and heating and fusing the bonding agent.

According to the present invention, oxygen-free atmosphere gas is supplied to the junctions of the semiconductor device and the printed circuit board; therefore, juncture with high reliability can be obtained without oxidation of the junctions in bonding. Additionally, since non-contact type laser heating means is employed as the means for heating and fusing the bonding agent while means for pressing down the body, except the junctions, of the semiconductor device is separately provided. a bonding tool would be never contaminated by the melted bonding-agent in their bonding, unlike the conventional case.

Accordingly, it is an object of the present invention to provide a bonding apparatus for making a junction of a semiconductor device with a printed circuit board by bonding without contamination of melted bonding-agent in the bonding.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Now, preferred embodiments of the present invention will be described with reference to the accompanying drawings.

Figure 1:
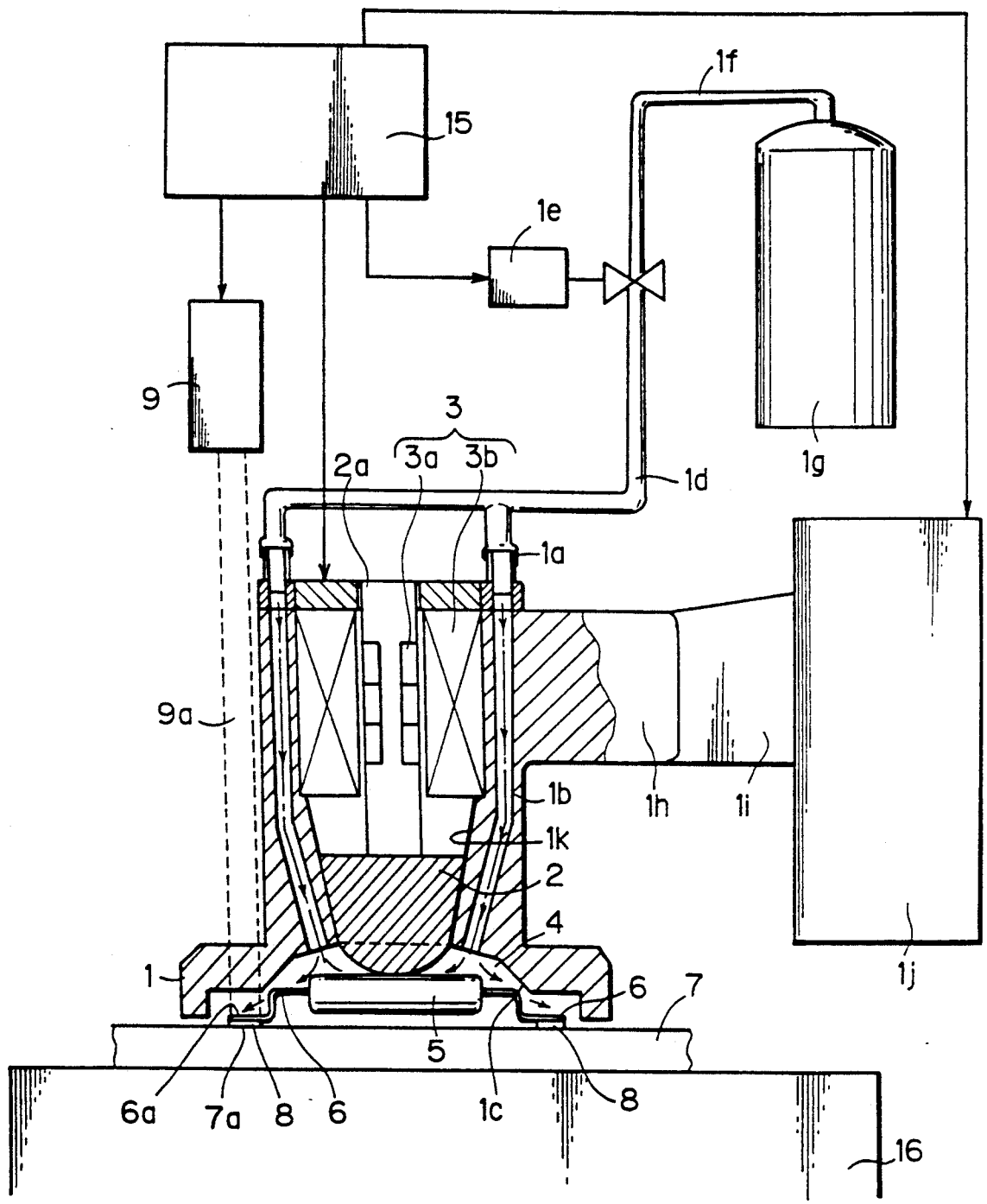
FIG. 1 is a partial cross-sectional view of a preferred embodiment of the present invention.

FIG. 1 is a partial cross-sectional view of a bonding apparatus of a preferred embodiment according to the present invention. In FIG. 1, an atmosphere cover 1 is formed of transparent material, such as quartz glass and the like, transmitting laser light. An atmosphere gas conducting pipe 1a is fixed into an upper portion of the atmosphere cover 1 while a gas conduit 1b, which is connected to the conducting pipe 1a and leads to a concavity 1c covering a semiconductor device 5, is formed in the atmosphere cover 1.

The conducting pipe 1a is connected to an electromagnetic valve 1e is connected through a tube 1d, while the electromagnetic valve 1e is connected through a tube 1f to a gas bomb 1g containing compressed nitrogen gas or mixed gas of nitrogen gas with a little hydrogen gas for reduction.

Opening and closing of the electromagnetic valve 1e are performed in response to a command given by a control unit 15.

The atmosphere cover 1 has a horizontal portion 1h where it is supported by a holder 1i. The holder 1i is moved upwards and downwards by a driving means 1j, and this allows the atmosphere cover 1 to move upwards and downwards.

The driving means 1j is connected to the control unit 15, and it operates in response to a command given by the control unit 15.

At the center portion of the atmosphere cover 1, there is formed a bore 1k through which a pressing weight 2 moves up and down. The pressing weight 2 is supported by a supporting shaft 2a.

A permanent magnet 3a is buried on a side of the supporting shaft 2a while an electromagnet 3b is attached to an inner wall of the bore 1k opposite the permanent magnet 3a. With the permanent magnet 3a combined with the electromagnet 3b, a well-known linear motor 3 formed there by works by varying an amount and a direction of current applied to the electromagnet 3b.

The linear motor 3 is controlled by the control unit 15 while the supporting shaft 2a is forced downward; in this way, the pressing weight 2 applies appropriate pressing force to the semiconductor device 5, and a junction 6a of a lead terminal 6 of the semiconductor device 5 is bonded to a junction 7a of a printed circuit board 7 in the optimum condition.

A laser device 9 is provided above the atmosphere cover 1, and laser light 9a from the laser device 9 is directed to the junction 6a of the lead terminal 6. The junction 6a is heated by laser so that bonding agent 8, such as solder, applied between the junction 6a of the lead terminal 6 and the junction 7a of the printed circuit board 7 is fused; eventually, the junction 6a of the lead terminal 6 is bonded to the junction 7a of the printed circuit board 7.

The control unit 15 controls the laser device 9 in timing the laser irradiation and adjusting its intensity.

A plurality of the laser devices 9 may be set in specified position by the number corresponding to the number of junctions of the semiconductor device 5, or rather, a laser device driving means may be provided so that the single laser device 9 may be moved to bond the junctions.

Now, the operation of this embodiment will be described.

Now, the operation of this embodiment will be described.

First, the printed circuit board 7 is mounted in a specified position of a base 16 and set so that each of the junctions 6a of the lead terminal 6 of the semiconductor device 5 may be registered with the corresponding junction 7a of the printed circuit board 7.

Conductive bonding agent 8, such as solder and the like, having a property of thermal fusion is applied in advance on the junction 6a of the lead terminal 6.

Naturally, a series of the above preparing steps may be manually performed, and an automatic operation by robots must significantly enhance an efficiency in production.

The bonding agent 8 may be applied in advance on the junction 7a of the printed circuit board 7.

Then, when a signal to inform that the semiconductor device 5 has been set on the printed circuit board 7 is applied to the control unit 15, the control unit 15 gives a command to a driving means 1j; in response to it, the driving means 1j starts and moves the atmosphere cover 1 downward and it halts the atmosphere cover 1 in a position where the concavity 1c of the atmosphere cover 1 covers an upper portion of the semiconductor device 5 while there remains slight gap between the lowermost end of the concavity 1c and a surface of the printed circuit board 7.

Next, the control unit 15 applies voltage to the linear motor 3 to control it, so that the pressing weight 2 press the semiconductor device 5 with the optimum load towards the printed circuit board 7.

This makes the semiconductor device 5 lie stable and results in the junction 6a of the lead terminal 6 being tightly affixed through the bonding agent 8 to the junction 7a of the printed circuit board 7.

The load by the pressing weight 2 is determined in accordance with a weight of the pressing weight 2 and a voltage applied to the linear motor 3, and the voltage value is set in advance so that it is the optimum in the control unit 15.

A lower portion of the bore 1k is tapered and becomes narrow as it runs down. This prevents the tapered pressing weight 2 from advancing downwards more than it needs; in this way, the semiconductor device 5 is protected.

Then, the control unit 15 gives a command to the electromagnetic valve 1e to open the valve, so that atmosphere gas 4 is supplied through the gas conduit 1b to the concavity 1c of the atmosphere cover 1 covering the semiconductor device 5.

Next, in response to a command of the control unit 15, the laser device 9 starts and irradiates the laser light 9a to the junction 6a. As mentioned above, since the atmosphere cover 1 is made of laser light transmitting material, such as quartz and the like, the laser light 9a transmitted by the atmosphere cover 1 heats the junction 6a of the lead terminal 6 and fuses the bonding agent 8 so that the junction 6a and the junction 7a of the printed circuit board 7 are bonded with each other.

Figure 2:
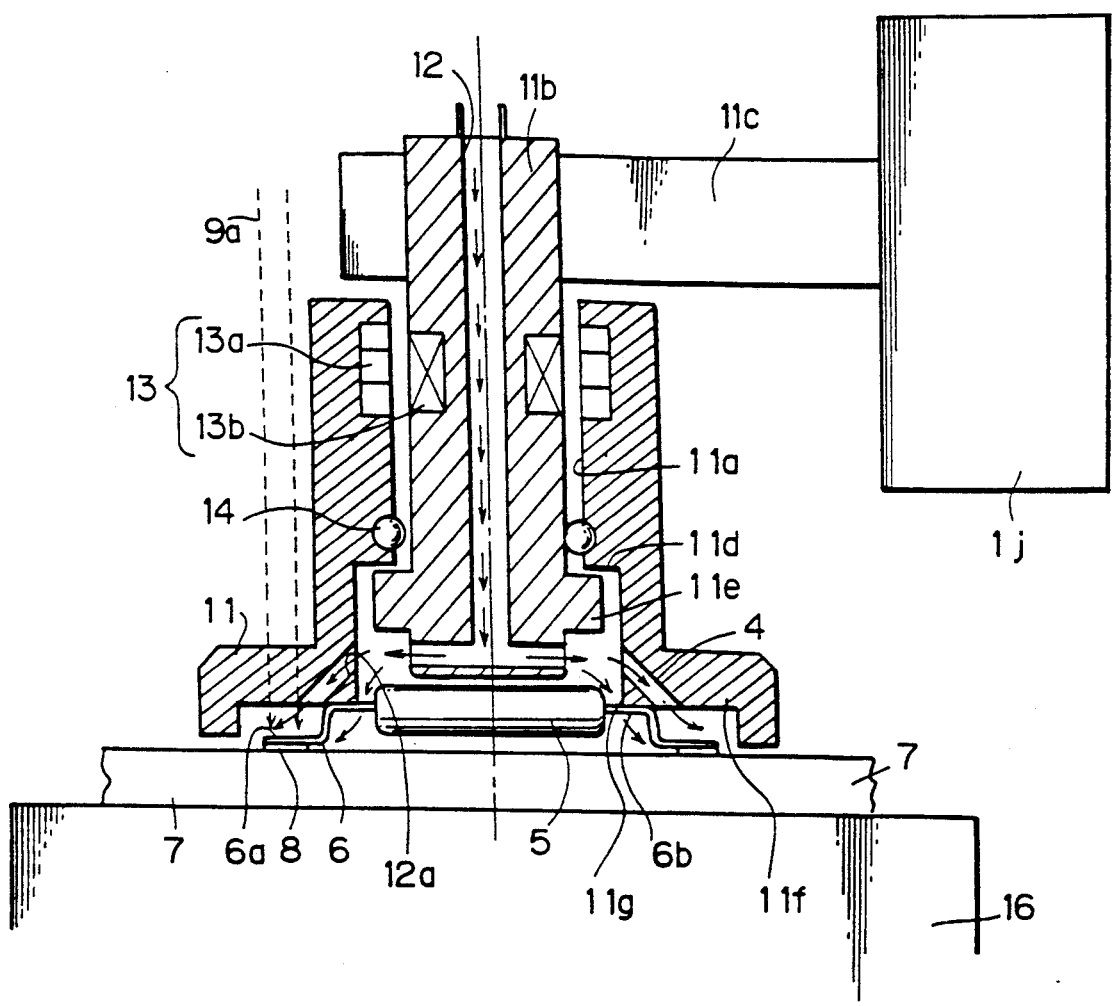
FIG. 2 is a partial cross-sectional view of another preferred embodiment of the present invention.
Figure 3:
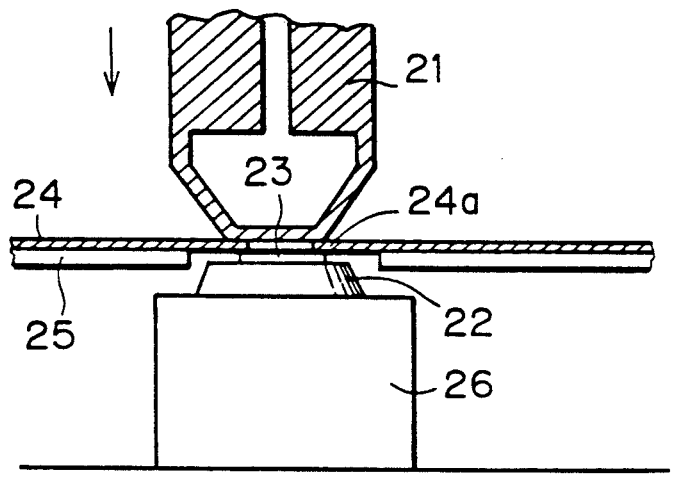
FIG. 3 is a diagram showing an example of a conventional bonding apparatus.

FIG. 2 is a partial cross-sectional view showing another preferred embodiment.

In FIG. 2, the laser device 9, the control unit 15, and the atmosphere gas supply system composed of the electromagnetic valve 1f, the gas bomb 1h and the like, are the same as those of the previous embodiment shown in FIG. 1, and so a detailed description of those components is omitted.

In this embodiment, an atmosphere cover 11 formed of laser light transmitting material, such as quartz and the like, has a bore 11a in its center portion, into which a holder 11b fits. The holder 11b is held by another horizontal holder 11c connected to a driving means 1j.

When the holder 11b is moved upward, a projection 11e of the holder 11b engages with a recess 11d at a lower portion of the bore 11a of the atmosphere cover 11, so that the atmosphere cover 11 may not slip off the holder 11b.

An electromagnet 13b is buried in the holder 11b while a permanent magnet 13a is buried in an inner wall of the bore 11a opposite to the electromagnet 13b. A linear motor 13 is formed of both the magnets similar to the embodiment shown in FIG. 1, and it applies load to the atmosphere cover 11 in a downward direction.

The atmosphere cover 11 also serves as a pressing tool, and a corner 11g in its lower concavity 11f comes in contact with an upper face of a shoulder 6b of the lead terminal 6. Thus, the linear motor 13 works to press the lead terminal 6 downwards with moderate pressing force.

In accordance with this system, the center of the semiconductor device 5 is not pressed down as shown in FIG. 1 but the lead terminal 6 is directly pressed; therefore, there is the advantage that the junction 7a can be pressed with even pressing force and with certainty.

An atmosphere gas conduit 12 is provided in the center of the holder 11b, branching off in its lower portion, and the atmosphere gas 4 flows in the direction towards the junction 6a of the lead terminal 6. Additionally providing a gas conduit 12a slanting to the junction 6a in the corner 11g the atmosphere gas divided along the conduit 12 in the above mentioned manner can flow more easily to the junction 6a.

The atmosphere cover 11 is guided by a guide bearing 14 almost in the center of an inner wall of the bore 11a so that it may tilt in any direction related to the holder 11b. When opposite shoulders 6b of the lead terminal 6 are different in level, the atmosphere cover 11 tilts in accordance with the level difference, and the opposite corners 11g in the concavity 11f come in contact with both the shoulders 6b of the lead terminal 6 so that the lead terminal can be always pressed evenly.

While the linear motor is employed as the pressing means, or the load means, in this embodiment, the eternal magnet and the electromagnet can be reversed in position, and additionally, any means can be employed instead of the linear motor if it can apply a fixed load in the linear direction under electrical control.

Also, while the lead terminal 6 of the semiconductor device 5 and the printed circuit board 7 are bonded with each other in this embodiment, this manner of bonding can be applied to the case where a semiconductor device and a lead line is to be bonded as in the prior art embodiment, and the same effect as in the above preferred embodiments can be exerted.

While the invention has been shown and described in detail, the foregoing description is in all aspects illustrative and not restrictive. It is therefore understood that numerous modifications and variations can be devised without departing from the scope of the invention.

What is claimed is:

1. A bonding apparatus, comprising:
    a base for supporting a printed circuit board;
    an atmosphere cover comprising a laser light transmitting material, which has a concavity formed for covering a semiconductor device mounted on the printed circuit board, a part of the concavity being formed to contact an upper portion of a lead terminal of the semiconductor device a lower portion of the atmosphere cover being formed to project over said lead terminal, at least said projecting portion being formed of said laser transmitting material;
    a holder for slidably holding the atmosphere cover and for facilitating vertical movement thereof between upper and lower positions;
    load means provided on the holder for applying a load toward said lower position of the atmosphere cover;
    driving means for moving the holder upward and downward with respect to the printed circuit board;
    atmosphere gas supplying means for supplying a selected atmosphere gas into the concavity; and
    laser heating means for irradiating laser light outside of said holder and through a part of the atmosphere cover towards a bonding agent applied on junctions of the semiconductor device and the printed circuit board, for heating and fusing the bonding agent.

2. A bonding apparatus in accordance with claim 1, wherein:
    said laser light transmitting material is quartz.

3. A bonding apparatus in accordance with claim 1, wherein:
    said load means is a linear motor provided in said holder.

4. A bonding apparatus in accordance with claim 1, wherein:
    said atmosphere gas supplying means includes means for supplying a gas flow including nitrogen.

5. A bonding apparatus in accordance with claim 1, wherein:
    said holder has a gas conduit connecting the outside to said concavity, and said atmosphere gas supplying means comprises
    a tube connected to said gas conduit,
    an electromagnetic valve connected to said tube, and
    a gas bomb connected to said electromagnetic valve.

6. A bonding apparatus in accordance with claim 1, wherein:
    said atmosphere cover further comprises a bearing disposed in a specified position on a slide surface of said holder, so that the atmosphere cover is guided thereby at a selected angle with respect to the holder.

7. A bonding apparatus in accordance with claim 1, further comprising:
    control means for controlling the operation of each of said driving means, said load means, said atmosphere gas supplying means and said laser heating means.

* * * * *